United States Patent
Swift et al.

(10) Patent No.: US 12,293,553 B2
(45) Date of Patent: May 6, 2025

(54) DATA COMPRESSION

(71) Applicant: Microsoft Technology Licensing, LLC, Redmond, WA (US)

(72) Inventors: Tad Douglas Swift, Bramley (GB); Adam James Miles, Woodley (GB)

(73) Assignee: Microsoft Technology Licensing, LLC, Redmond, WA (US)

( * ) Notice: Subject to any disclaimer, the term of this patent is extended or adjusted under 35 U.S.C. 154(b) by 486 days.

(21) Appl. No.: 17/676,706

(22) Filed: Feb. 21, 2022

(65) Prior Publication Data

US 2023/0267650 A1 Aug. 24, 2023

(51) Int. Cl.
| | | |
|---|---|---|
| G06T 9/40 | (2006.01) |
| G06T 1/20 | (2006.01) |
| G06T 9/00 | (2006.01) |
| G06T 15/06 | (2011.01) |
| G06T 17/10 | (2006.01) |

(52) U.S. Cl.
CPC .................. *G06T 9/40* (2013.01); *G06T 1/20* (2013.01); *G06T 9/001* (2013.01); *G06T 15/06* (2013.01); *G06T 17/10* (2013.01)

(58) Field of Classification Search
None
See application file for complete search history.

(56) References Cited

U.S. PATENT DOCUMENTS

| | | | | |
|---|---|---|---|---|
| 2011/0080403 | A1* | 4/2011 | Ernst ...................... | G06T 15/06 |
| | | | | 345/420 |
| 2020/0160588 | A1* | 5/2020 | Muthler ................. | G06T 15/06 |
| 2022/0051467 | A1 | 2/2022 | Woop et al. | |
| 2023/0206383 | A1* | 6/2023 | Szerszen ................ | G06F 12/04 |
| | | | | 345/555 |

FOREIGN PATENT DOCUMENTS

GB 2474102 A 4/2011

OTHER PUBLICATIONS

"International Search Report and Written Opinion Issued in PCT Application No. PCT/US23/011084", Mailed Date: May 4, 2023, 11 Pages.

* cited by examiner

*Primary Examiner* — Leon Viet Q Nguyen
(74) *Attorney, Agent, or Firm* — Rainier Patents, P.S.

(57) ABSTRACT

The present concepts relate to lossless data compression techniques for reducing the size of a data structure. Certain data in the data structure that can be either recovered from another source or rebuilt from other available information may be removed from the data structure. To further reduce data size, the retained data in the data structure may be packed into a smaller-bit encoding data type. Additionally, to reduce the data size even more, the packed data may be zipped using a lossless data compression algorithm. To regain the original data structure, the process may be reversed. The zipped data may be unzipped using a lossless data decompression algorithm. The packed data may be unpacked into the original bit-sized data encoding. The removed data may be restored by either recovering it from another source or rebuilding it from other available information.

20 Claims, 9 Drawing Sheets

DATA COMPRESSION

BACKGROUND

Data sizes of all kinds of information, such as photos, videos, and applications, have grown in the past and are continuing to grow. With limited memory for storing data and limited bandwidth for transferring data, techniques for compressing data are useful in many applications.

SUMMARY

The present concepts relate to compressing a data structure, and thereby reducing the size of the data structure. In some implementations, a data structure may be compressed by removing any data that may later be sourced elsewhere or later be rebuilt. The remaining data that has not been removed from the data structure may be compacted. Therefore, the compressed data structure may take less storage space and be transferred faster. The compressed data structure may be decompressed to regain the original uncompressed data structure by restoring the removed data.

BRIEF DESCRIPTION OF THE DRAWINGS

The detailed description below references accompanying figures. The use of similar reference numbers in different instances in the description and the figures may indicate similar or identical items. The example figures are not necessarily to scale.

DETAILED DESCRIPTION

The present concepts relate to data compression and, therefore, are applicable in a wide variety of fields. However, for the purpose of explaining the present concepts using concrete details, the present concepts will be described below in the context of three-dimensional ("3D") computer graphics in the gaming art.

Technological Background

A game developer may use a computer to create a virtual 3D world containing 3D objects during offline development stages of the game. At runtime when the game is being played, depending on the current state of gameplay, a particular view or scene of a portion of the virtual 3D world may be rendered on a two-dimensional ("2D") display screen.

Figure 1:
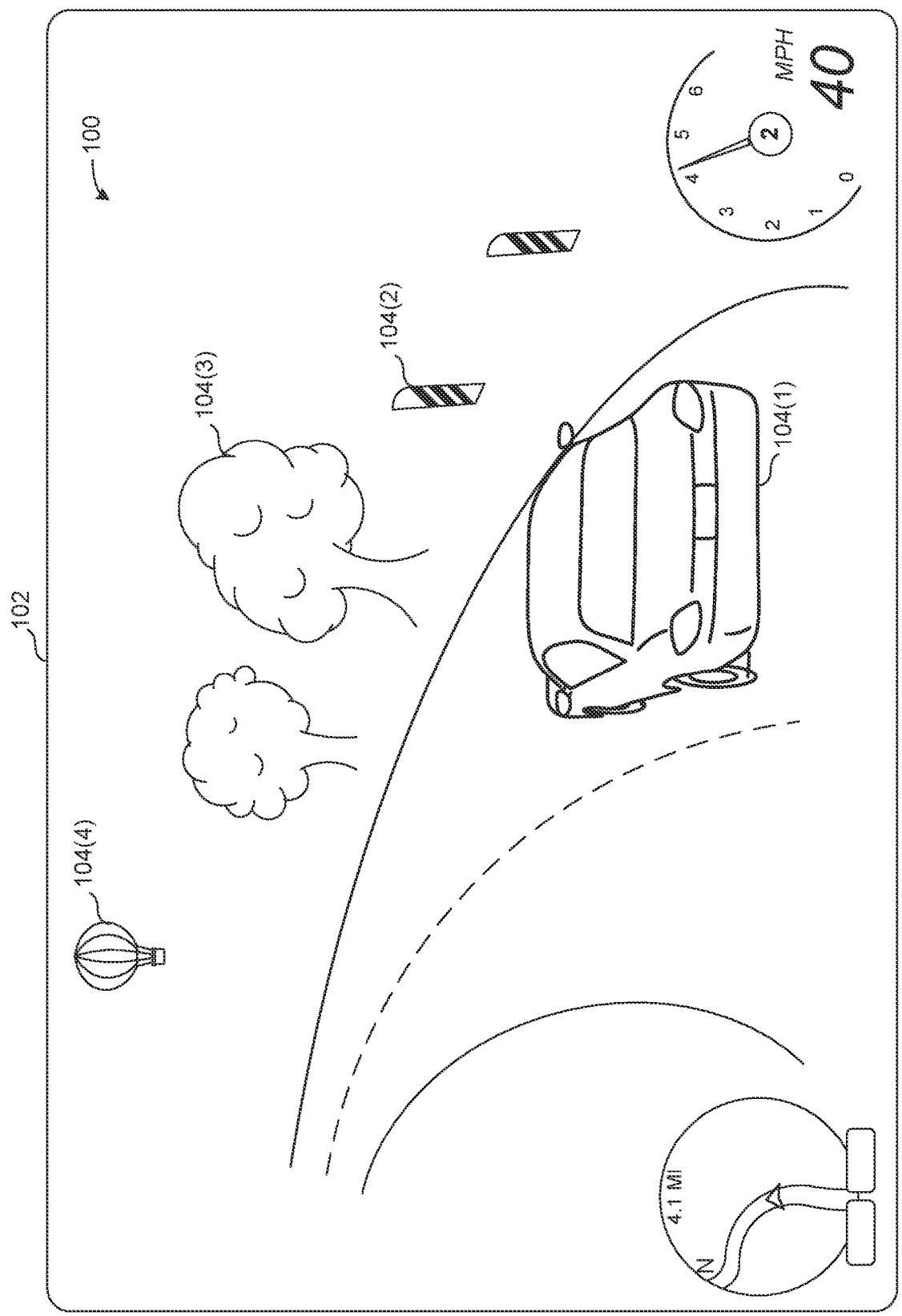
FIG. 1 shows a computer-generated scene, which may be used with some implementations of the present concepts.

FIG. 1 shows a computer-generated scene 100, which may be used with some implementations of the present concepts. The example scene 100 illustrated in FIG. 1 may be a view of a virtual 3D world in a car racing game, but other examples are possible. The scene 100 may be rendered and displayed on a display screen 102, which may be any type of a display device, such as a monitor, a laptop screen, a television, a projector screen, a smartphone screen, etc.

The virtual 3D world for the car racing game may include one or more objects 104. Some or all of the objects 104 may be visible on the display screen 102 based on the current state of the game and may be rendered on the display screen 102 for a user to see while playing the game. For the state of the game that is illustrated in FIG. 1, several objects 104 may be visible from the perspective of an imaginary camera that represents the user's eyes. In this scene 100, those objects 104 include at least a car 104(1), a street sign 104(2), a tree 104(3), and a hot air balloon 104(4). Additional objects (including backgrounds, sky, landscapes, roads, and terrain) may be displayed as well. Moreover, additional objects may be in the virtual 3D world but are not currently visible because other visible objects are obstructing their view. FIG. 1 is a simplified representation containing only a few objects as illustrative examples.

The objects 104 in the virtual 3D world may be represented by models created by a game developer. Model data may include, for example, geometric shapes such as polygons, colors including textures, and any other information relevant to visually rendering the objects to the user and relevant to allowing the objects to be interactive in the virtual 3D world.

The objects 104 displayed during the game may change very quickly as gameplay advances and game scenarios change. For example, the car 104(1) may turn, jump, or flip. The street sign 104(2) may appear to increase in size or the perspective viewing angle of the street sign 104(2) may change as the car 104(1) moves forward. All or a portion of the tree 104(3) may be covered and obstructed from the camera view as another object (such as the car 104(1)) moves in front of it. The hot air balloon 104(4) may disappear off the display screen 102 either because the hot air balloon 104(4) moved in the virtual 3D world or because the view screen moved away from the hot air balloon as the car 104(1) drives away in a different direction. Furthermore, new objects may appear onto the scene 100. For example, as gameplay continues, a competitor car may appear on the road; or other trees, street signs, buildings, pedestrians, or any object may appear onto the scene 100.

Raytracing is a technique used in rendering 3D computer graphics on a 2D screen. Raytracing may involve shooting multiple rays from the imaginary camera into the virtual 3D world and calculating which objects intersect the rays (i.e., hits) to determine which objects should be displayed on which pixels of the display screen. Additionally, raytracing may involve shooting multiple rays from a virtual light source into the virtual 3D world and calculating which objects intersect the rays to determine which objects are lit and which objects are in shadow.

Figure 2:
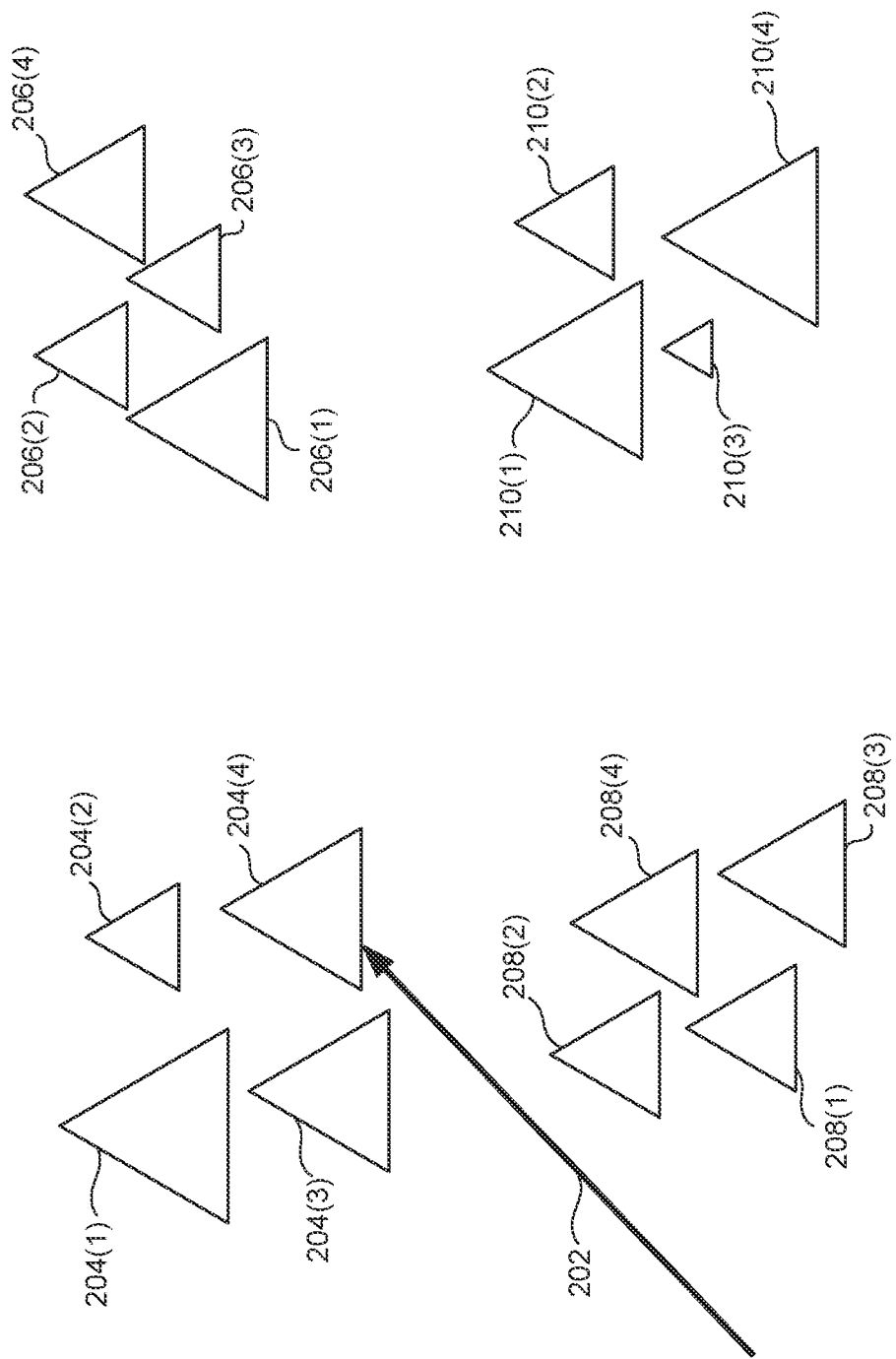
FIG. 2 shows raytracing, which may be used with some implementations of the present concepts.

FIG. 2 shows raytracing, which may be used with some implementations of the present concepts. FIG. 2 is a simplified illustration of example raytracing that shows only one ray 202 that corresponds to one pixel on the display screen 102 and shows only a few polygons in the virtual 3D world. In this example, a first set of triangles 204 may represent the polygons that model the car 104(1) in FIG. 1, a second set of triangles 206 may represent the polygons that model the street sign 104(2) in FIG. 1, a third set of triangles 208 may represent the polygons that model the tree 104(3) in FIG. 1, and a fourth set of triangles 210 may represent the polygons that model the hot air balloon 104(4) in FIG. 1. Because FIG. 2 has been simplified for the purpose of illustration, the number, position, size, and orientation of the triangles may not be accurate nor to scale. For example, although each triangle in FIG. 2 is illustrated as being flat along a common plane for simplicity, different triangles may be oriented along different planes in the virtual 3D world.

To render the scene 100 in FIG. 1, the ray 202 may be shot from the camera's perspective to determine which triangle, if any, in the virtual 3D world intersects with the ray 202 first. In this example, the triangle 204(4) corresponding to a portion of the car 104(1) intersects with the ray 202 first before any other triangles in the virtual 3D world. Thus, the color associated with the intersection point of the triangle 204(4) may be displayed on the pixel of the display screen 102 that is associated with the ray 202. Any additional triangles that may intersect the ray 202 at a farther distance than the triangle 204(4) would be obstructed from the view of the camera and thus invisible in the scene 100 and need not be rendered on the display screen 102. By repeating this raytracing calculation for every pixel of the display screen 102 using multiple rays, the visible portions of the virtual 3D world can be rendered on the display screen 102 to show the scene 100 to the user.

Unfortunately, raytracing can be an extremely tedious and slow process if every ray were checked for intersection with every triangle in the virtual 3D world. For instance, a typical virtual 3D world may include around 20 million triangles. Furthermore, a typical 4K display screen having a 4096× 2160 pixel resolution may include around 8 million pixels, requiring 8 million rays shot from the camera view (and even more rays shot from the virtual light source). Therefore, a brute force method of checking every triangle against every ray would require around 160 trillion intersection tests, which would take around 30 minutes per single frame using a high-end personal computer ("PC"). This is an unworkable method, because modern games and display screens typically render around 30, 60, or 120 frames per second.

Bounding volume hierarchy ("BVH") is a type of data structure for organizing geometric data into a tree structure. A BVH builder may build a BVH based on the polygon data in the models of objects. The BVH can be used to greatly expedite the raytracing calculations performed in rendering a virtual 3D world.

Figure 3:
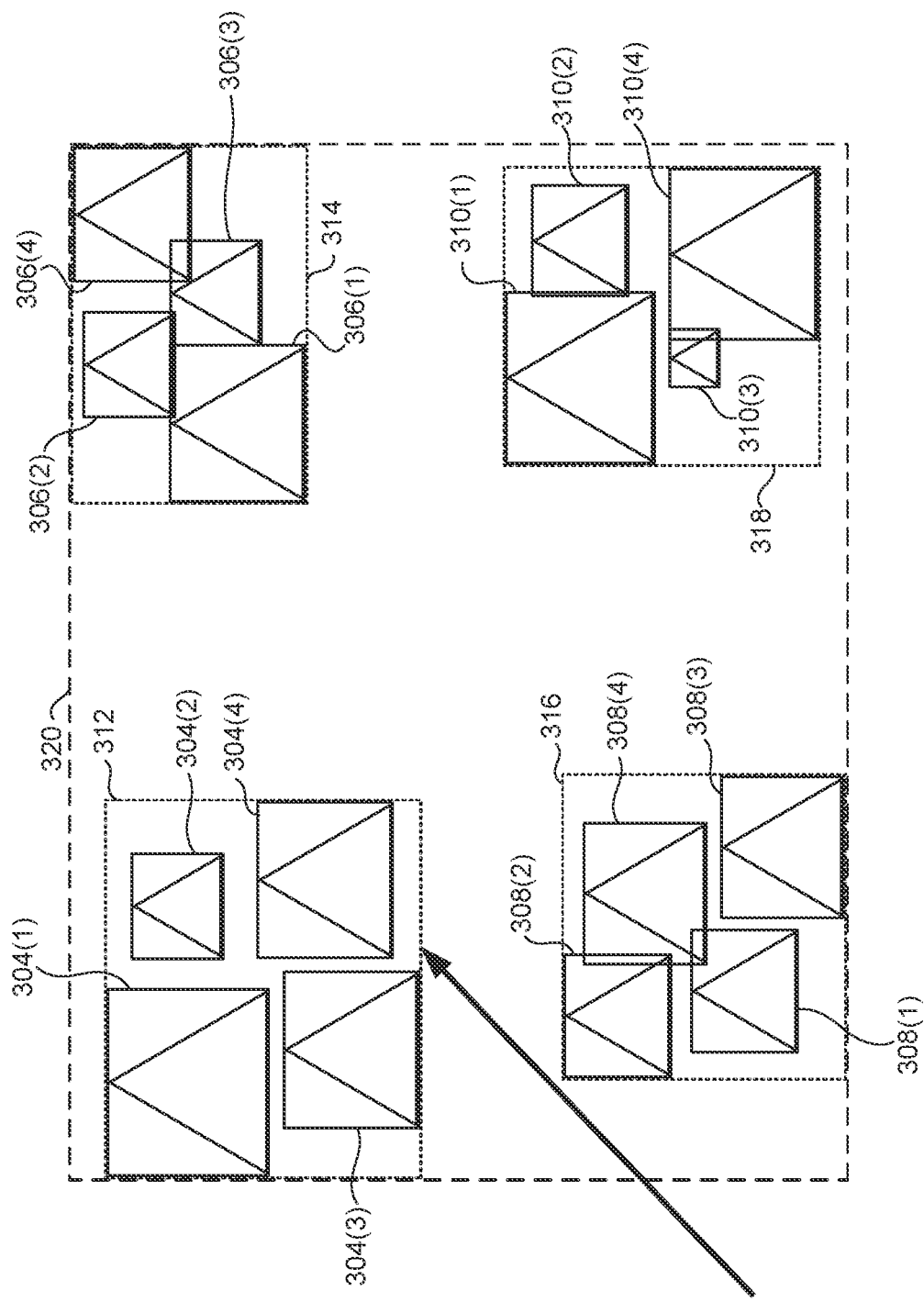
FIG. 3 shows raytracing with bounding volumes, which may be used with some implementations of the present concepts.

FIG. 3 shows raytracing with bounding volumes, which may be used with some implementations of the present concepts. FIG. 3 shows the same four sets of triangles 204, 206, 208, 210 in FIG. 2. Each of the triangles may be bound (i.e., wrapped or enclosed) in a bounding volume calculated by a BVH builder. These bounding volumes may be minimum bounding 3D boxes, although they are drawn as 2D boxes in FIG. 3 for simplicity. For example, a bounding volume 304(1) may wrap the triangle 204(1) of the car 104(1), and a bounding volume 310(4) may wrap the triangle 210(4) of the hot air balloon 104(4). The four sets of bounding volumes 304, 306, 308, 310 that enclose the four sets of triangles 204, 206, 208, 210 are shown as solid-line boxes in FIG. 3.

Next, the BVH builder may calculate larger bounding volumes that minimally encapsulate each of the four sets of bounding volumes 304, 306, 308, 310. For instance, a bounding volume 312 may wrap the first set of bounding volumes 304(1), 304(2), 304(3), 304(4) for the car 104(1), a bounding volume 314 may wrap the second set of bounding volumes 306(1), 306(2), 306(3), 306(4) for the street sign 104(2), a bounding volume 316 may wrap the third set of bounding volumes 308(1), 308(2), 308(3), 308(4) for the tree 104(3), and a bounding volume 318 may wrap the fourth set of bounding volumes 310(1), 310(2), 310(3), 310(4) for the hot air balloon 104(4). These higher-level parent bounding volumes 312, 314, 316, 318, which are shown as dotted-line boxes in FIG. 3, may be minimum bounding 3D boxes that can enclose the lower-level child bounding volumes 304, 306, 308, 310. The BVH builder may repeat this process until all objects 104 in the virtual 3D world are enclosed by one large root bounding volume 320, which is shown as a dashed-line box in FIG. 3.

Figure 4:
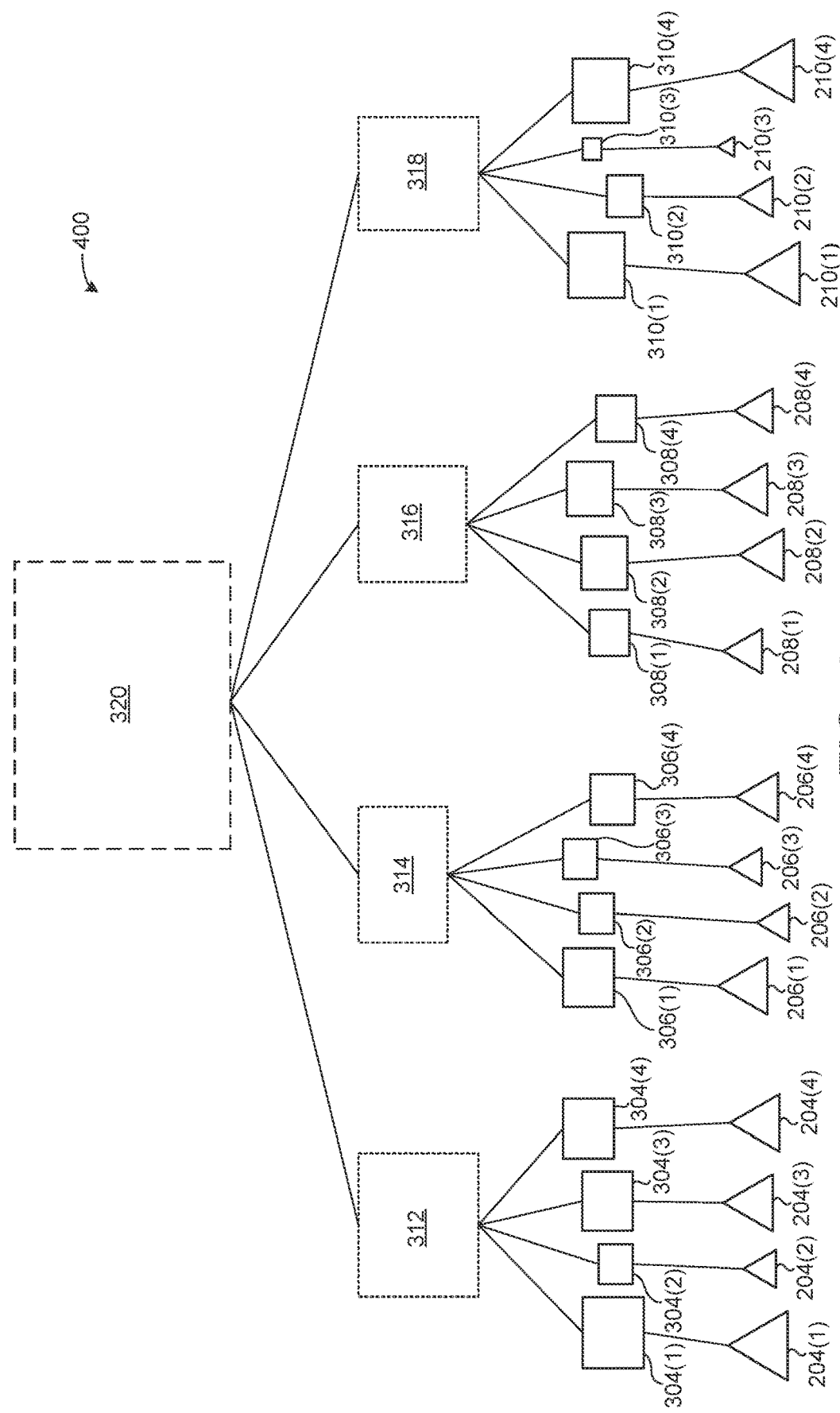
FIG. 4 shows a bounding volume hierarchy, which may be used with some implementations of the present concepts.

FIG. 4 shows a bounding volume hierarchy ("BVH") 400, which may be used with some implementations of the present concepts. The BVH 400 may store data in a tree structure that includes a set of nodes arranged in a parent-child relationship. The set of nodes may include a root node (often called the "root" for short), one or more levels of intermediary nodes, and terminal nodes (or "leaf nodes" or "leaves"). The BVH builder may construct the BVH 400. The BVH 400 may include leaves containing polygon data from the models that represent the objects in the virtual 3D world. For example, the leaves in the BVH 400 may include geometric data relating to the triangles 204, 206, 208, 210 in FIG. 2 that represent the car 104(1), the street sign 104(2), the tree 104(3), and the hot air balloon 104(4) in FIG. 1. At the next higher level above the leaf nodes, the BVH 400 may include intermediary nodes containing geometric data representing the bounding volumes 304, 306, 308, 310 (shown as solid-line boxes) that wrap the triangles 204, 206, 208, 210. At higher levels, the BVH 400 may include additional intermediary nodes containing geometric data representing the bounding volumes 312, 314, 316, 318 (shown as dotted-line boxes), and so on. Eventually, at the highest level of the tree, the BVH 400 may include a root node containing geometric data representing the bounding volume 320 (shown as a dashed-line box).

Accordingly, the BVH 400 may represent a hierarchical tree structure where the tree or any subtree is organized in such a way that any triangle or a bounding volume in a child node fits inside a bounding volume in a parent node. Therefore, at the bottom of the tree may be leaf nodes containing the same triangle data that make up the models, and higher up the tree are progressively coarser bounding volumes.

Again, FIG. 3 and FIG. 4 show simple examples of BVH for illustration purposes. The number of child bounding volumes inside each parent bounding volume can vary. The triangles may be grouped together based on proximity to each other and/or based on their membership in the same object. The depth and the width of the BVH hierarchy can vary.

As mentioned above, the BVH 400 can speed up the raytracing process. In FIG. 2, without the BVH 400, the ray 202 may be tested for intersection with every triangle in the virtual 3D world, which can be a painstakingly long process. In FIG. 3, using the BVH 400, the ray 202 may first be tested for intersection with the bounding volume 320 (the dashed-line box) at the root node of the BVH 400. If the ray 202 does not intersect the bounding volume 320, then the ray 202 cannot intersect any of the triangles inside the bounding volume 320. That is, the ray 202 will not intersect any of the triangles in the child leaf nodes below the bounding volume 320 in the hierarchy of the BVH 400. Thus, the determination that the ray 202 does not intersect any of the potentially millions of triangles can be made by the first iteration of only one intersection test without testing each and every triangle one by one.

If the ray 202 intersects the bounding volume 320 (as shown in FIG. 3), then, in the next iteration, the ray 202 may be tested for intersection with bounding volumes 312, 314, 316, 318 (the dotted-line boxes in FIG. 3) that are in the child nodes under the bounding volume 320 in the hierarchy of the BVH 400. As shown in FIG. 3, the ray 202 does not intersect the bounding volumes 314, 316, 318 that wrap the street sign 104(2), the tree 104(3), and the hot air balloon 104(4). Therefore, in this second iteration of intersection tests, the determination that the ray 202 does not intersect any of the second, third, and fourth sets of triangles 206, 208, 210 can be made without testing each of those triangles.

In this example, the ray 202 intersects the bounding volume 312 that wraps the car 104(1). Therefore, the raytracing process may continue to step down the tree hierarchy of the BVH 400 for the next iteration of intersection tests. That is, the ray 202 may be tested for intersection with the bounding volumes 304(1), 304(2), 304(3), 304(4) that are in the child nodes under the bounding volume 312 in the hierarchy of the BVH 400.

In this example, as shown in FIG. 3, the ray 202 does not intersect the bounding volumes 304(1), 304(2), 304(3). Therefore, it can be determined that the ray 202 cannot intersect the triangles 204(1), 204(2), 204(3) that are inside the bounding volumes 304(1), 304(2), 304(3) in the virtual 3D world and are in the leaf nodes below those bounding volumes 304(1), 304(2), 304(3) in the hierarchy of the BVH 400.

In this example, as shown in FIG. 3, the ray 202 intersects the bounding volume 304(4). Therefore, the raytracing process may step down the BVH hierarchy in the next iteration and test whether the ray 202 intersects the triangle 204(4), which is in the child leaf below the bounding volume 304(4) in the BVH 400. In this example, as shown in FIG. 3, the ray 202 intersects the triangle 204(4). Thus, the color of the intersection point on the triangle 204(4) may be displayed on the pixel of the display screen 102 corresponding to the ray 202.

Because the bounding volumes that wrap the triangles are larger than the triangles and because higher-level bounding volumes are larger than the lower-level bounding volumes that they wrap, intersection tests can result in false positives. That is, even if the ray 202 intersects the bounding volume 320 (the dashed-line box), the ray 202 may not intersect any of the bounding volumes 312, 314, 316, 318 (the dotted-line boxes). Similarly, even if the ray 202 intersects the bounding volume 304(4), the ray 202 may not intersect the triangle 204(4). When such a scenario occurs, the raytracing process may revert back by stepping up the tree hierarchy in the BVH 400 and continue testing any sibling nodes that result in positive intersection tests. Furthermore, as mentioned above, the raytracing process may not stop when a single intersection between the ray 202 and a triangle is found. The raytracing process may continue to step up and down the hierarchy tree to potentially finding other triangles that intersect with the ray 202 so long as there are positive intersection test results. Where multiple triangles intersect with the ray 202, the triangle corresponding to the closet intersection distance may be rendered on the display screen 102 as being in front of the other intersecting triangles.

As the above example illustrates, using the BVH 400 to perform raytracing can greatly reduce the number of intersection tests performed. Rather than performing intersection tests for every triangle in the virtual 3D world, groups of many triangles may be discarded (i.e., not tested) at each iteration based on their position in the BVH tree hierarchy. For instance, in a real-world example, the nearest triangle for a ray shot into a virtual 3D world having 16 million triangles can be found in about 14 iterations.

Figure 5C:
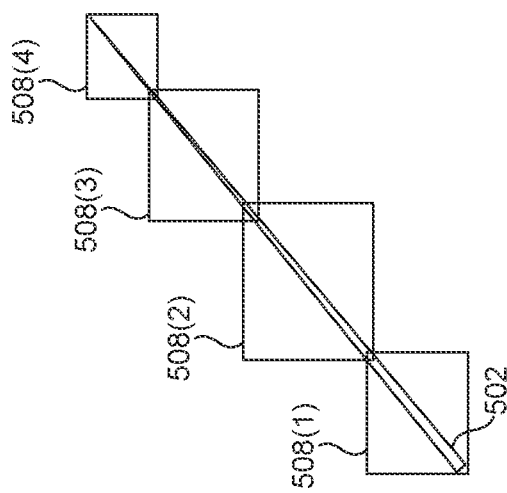
FIGS. 5A, 5B, and 5C show raytracing with varied bounding volumes, which may be used with some implementations of the present concepts.
Figure 5B:
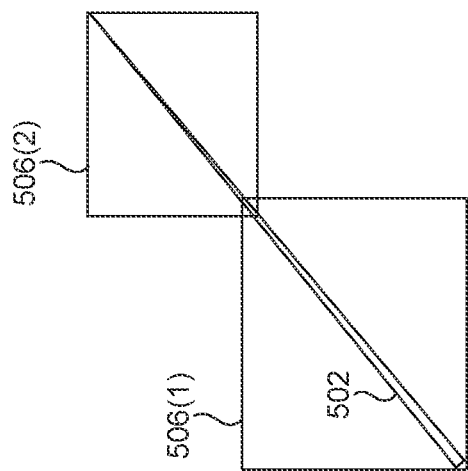
Figure 5A:
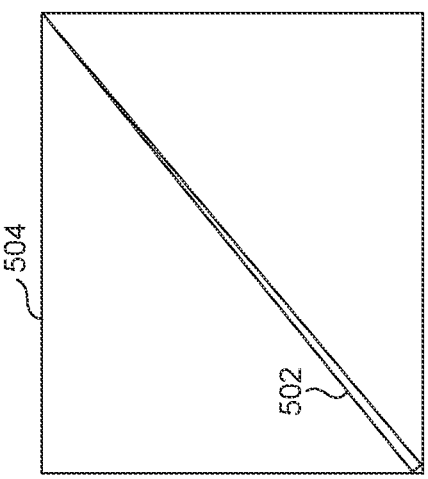

FIGS. 5A, 5B, and 5C show raytracing with varied bounding volumes, which may be used with some implementations of the present concepts. BVH has some inefficiencies that can be addressed by varying the bounding volumes. FIG. 5A shows an example of an odd-shaped polygon that illustrates an inefficiency associated with BVH. For example, FIG. 5A shows a triangle 502 that is long and narrow. Such a triangle may exist on an object that is long and skinny, such as a pole or a bar, or may exist at an edge, corner, or crevice of an object. Simply constructing a default bounding volume 504 that minimally encloses the triangle 502 may result in a very large bounding volume. Thus, a large majority of the 3D space inside the default bounding volume 504 may be empty, and only a small fraction of the space inside the default bounding volume 504 may be taken up by the triangle 502. Similar to FIGS. 2-4, the triangle 502 and the default bounding volume 504 in FIG. 5 may be in a virtual 3D world even though they are drawn as 2D shapes for simplicity.

Such disproportionately large default bounding volume 504 that does not tightly fit the triangle 502 can produce a lot of false positive intersection test results. That is, the odds of many rays intersecting the default bounding volume 504 may be high, while only a small percentage of those rays may actually intersect the triangle 502. These false positives can waste time and computing resources in performing intersection tests that do not result in actual intersections between the rays and the triangle 502. This problem may be further compounded, because the overly large default bounding volume 504 in the parent node directly above the child leaf for the triangle 502 in the BVH tree would require additional bounding volumes that wrap the default bounding volume 504 higher up in the BVH tree to be unnecessarily large as well.

The BVH builder may address this problem by using an optimization technique that varies the size and/or and the number of bounding volumes that wrap the triangle 502. FIG. 5B shows the triangle 502 wrapped in two varied bounding volumes 506. Effectively, the BVH builder may split the large default bounding volume 504 in FIG. 5A into two smaller, overlapping varied bounding volumes 506(1), 506(2) in FIG. 5B. Varying the default bounding volume 504 in this way may reduce the chances of false positives (i.e., the odds of a ray intersecting the varied bounding volume 506 but not intersecting the triangle 502) by about 40% to 50%. Moreover, the BVH builder may adjust the BVH tree to accommodate the additional varied bounding volumes 506 by adding additional nodes.

The BVH builder can continue this optimization technique by further splitting the varied bounding volumes 506 into multiple varied bounding volumes 508, as shown in FIG. 5C, and adding more intermediary nodes to the BVH hierarchy, thereby further reducing the odds of false positives. The optimization technique of varying the bounding volumes to more closely fit the triangle 502 may be continued, for example, until some heuristics determine that the benefits no longer outweigh the costs of additional processing. Although the performance improvement provided by this optimization technique can vary depending on many factors, in one experimental test, this optimization technique improved raytracing performance by a factor of four.

Technological Problems

Raytracing can be performed by software or hardware. However, due to the need to perform many intersection calculations rapidly to provide smooth rendering of many scenes at a high frame rate, raytracing is typically performed by hardware, such a graphics processing unit ("GPU"). A GPU that supports raytracing and BVH may expect a BVH of a model in a particular format.

A game developer may create a game offline. The game developer may create 3D models for all the objects in a virtual 3D world for the game. Then, the game developer may generate raytracing data using the model data so that scenes from the game can be rendered on a display screen by GPU that performs raytracing. For example, the game developer may use a BVH builder to create BVH structures associated with the models. The BVH structures may be compatible with specific GPUs. The models and the BVH structures may be packaged together before the game is released. In one implementation, a game package may include multiple BVH tree structures, where each BVH tree represents a particular object. In an alternative implementation, the game package may include one large BVH tree structure for all the objects, where a particular subtree represents an object. During runtime, when the game is being played, the BVH structures may be provided to the GPU to quickly perform raytracing and render successive scenes of the game onto a display screen.

A technological problem associated with generating and using BVH is that BVH data can consume a lot of storage space. A BVH structure for even one complex asset (e.g., a 3D object) in a game can be a considerable size, such as multiple megabytes (MBs). For a large game involving complex scenes with many objects, the BVH data can take up multiple gigabytes (GBs) of storage. For example, BVH data for a virtual 3D world containing 20 million triangles may consume 800 MB to 1 GB of storage.

The large-sized nature of BVH data can cause many technological disadvantages. A game with large BVH data can be difficult or impossible to fit on a removable storage, such as a compact disc ("CD"), a digital video disc ("DVD"), or a universal serial bus ("USB") flash drive. Such media have limited storage space for large games. Furthermore, even a large hard drive can quickly fill up with only a few games having large BVH data. Moreover, a game with large BVH data can take a long time to download (i.e., transfer over a network) and install. Additionally, the large amount of storage space taken up by BVH data may limit the amount of storage space available for other assets of the game. Accordingly, these constraints may force a game developer to sacrifice many aspects of the game, including the number of models, model complexity, graphics resolution, texture details, frame rate, etc.

BVH data size may be reduced a little bit using conventional lossless data compression algorithms, such as DEFLATE, ZIP, ZLIB, or GZIP. However, these conventional compression techniques are limited in that they have to keep all of the BVH data intact, i.e., no data can be lost. Furthermore, BVH data includes polygon data and vertex positions, which are relatively random for compression purposes. Therefore, data compression ratio is fairly poor (i.e., BVH data does not compress much) using such conventional lossless data compression algorithms. Furthermore, GPUs prescribe specific criteria for how triangle data, bounding volume data, and BVH tree data must be formatted, thus limiting the ability to format the data differently to save storage space. Accordingly, there is a need to significantly reduce the size of BVH data without sacrificing the quality of games.

Technological Solutions Summary

The present concepts involve lossless data compression techniques that can reduce data size significantly more than conventional lossless data compression techniques. In some implementations of the present concepts, compressing data may involve removing data that can later be restored.

For example, recoverable data inside a data structure, where a duplicate of the recoverable data exists in other available sources, may be stripped away from the data structure to reduce the size of the compressed data structure for storage and/or transfers. Then later, the duplicate of the removed data in an available source may be copied and reinserted into the compressed data structure, thereby restoring the original data structure.

As another example, rebuildable data inside a data structure that could be later rebuilt using available information may be deleted from the data structure, thereby reducing the size of the compressed data structure for storage and/or transfers. Later, the compressed data structure may be decompressed by rebuilding the deleted data based on the other information to regain the original data structure.

In some implementations, the present concepts may be used to compress BVH data and thus significantly reduce the size of BVH data. For instance, a game developer may create 3D models and use a BVH builder to generate BVH data based on the models. Then, during offline development of the game, the game developer may use a compression function to compress the BVH data by removing any data that could later be reconstituted quickly at runtime when the game is being played. Thus, the game package that is released may include the compressed BVH data that takes up significantly less space than the uncompressed BVH data. Then, when a game player is playing the game, a decompression function may decompress the compressed BVH data into the original form of the BVH data that is compatible with the GPU that performs raytracing. In some implementations, the compression function may remove data offline that the decompression function can quickly reconstitute at runtime so as to still enable raytracing to be performed quickly enough (i.e., in real time) to meet the demands of rendering game scenes. That is, data that cannot be reconstituted if removed and data that cannot be reconstituted quickly enough at runtime to allow speedy raytracing may be retained in the compressed BVH data.

The present concepts provide a technological solution to the problems and disadvantages of conventional techniques described above. Compressing the BVH data, which decreases the BVH size and thus decreases the game package size, provides many advantages. The compressed BVH may allow the game, and perhaps multiple games, to fit on a game disc or on other removal drives with limited storage space. A game with a compressed BVH would be faster to transfer over a network, and thus take less time for game players to download and be faster to install on a hard drive. The game would take up less space on a hard drive. The game would be faster to load into memory.

Data Structure

Figure 6A:
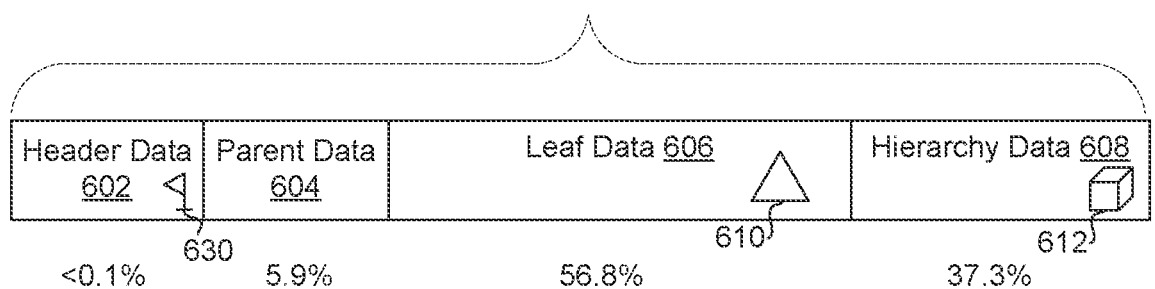
FIG. 6A shows an uncompressed data structure, which may be used with some implementations of the present concepts.

FIG. 6A shows an uncompressed data structure 600, which may be used with some implementations of the present concepts. In this example, the uncompressed data structure 600 may be an uncompressed BVH structure having a certain uncompressed size. An uncompressed BVH structure may be a collection of data. In one implementation, the uncompressed BVH structure may include header data 602, parent data 604, leaf data 606, and hierarchy data 608.

The leaf data 606 may include triangle data 610 from the models of objects. The hierarchy data 608 may include bounding volume data 612. The hierarchy data 608 may include node data about the nodes in the tree. A node may store a bounding volume along with data about the child nodes below it in the tree. In one implementation, a bounding volume may be represented by and stored as two points in 3D space. The two points may be opposite vertices of a 3D box. A BVH builder may calculate the two points that minimally enclose a polygon (e.g., a triangle) or minimally enclose a set of bounding volumes. As the number of triangles in the virtual 3D world increases, the number of leaf nodes in the uncompressed data structure 600 may increase. Furthermore, as the number of leaf nodes increases, the size of the hierarchical tree and the number of intermediary nodes may increase.

The parent data 604 may include hierarchy information. For example, the parent data 604 may include a large array of identifications ("IDs") that identify the positions of the bounding volumes in the hierarchy tree. Thus, the parent data 604 can help identify the parent node of any leaf node or intermediary node in the tree. The parent data 604 may be used to traverse the hierarchy, i.e., walk up the tree.

FIG. 6A shows the relative storage sizes of the various types of data inside the uncompressed data structure 600 as percentages of the total uncompressed size of the uncompressed data structure 600. In this example, the leaf data 606 may constitute 56.8%, the hierarchy data 608 may constitute 37.3%, the parent data 604 may constitute 5.9%, and the header data 602 may constitute less than 0.1% of the total uncompressed size of the uncompressed data structure 600. These percentage values are just one example for illustration purposes. The actual division of data components can vary from one data structure to another. Also, the sizes of the divisions of the data components are not drawn to scale in FIG. 6A.

As shown in FIG. 6A, a large majority of the uncompressed data structure 600 may be taken up by the leaf data 606 and the hierarchy data 608—a combined 94.1% in this example. That is, the majority of the uncompressed data structure 600 consists of the triangle data 610 from the models and the bounding volume data 612 that is calculated based on the triangle data 610.

Figure 6B:
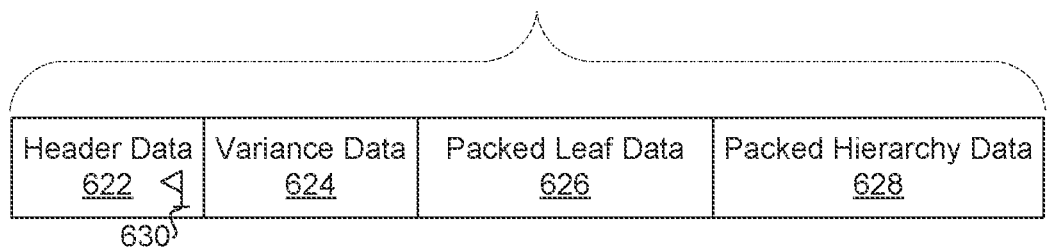
FIG. 6B shows a compressed data structure, which may be used with some implementations of the present concepts.

FIG. 6B shows a compressed data structure 620, which may be used with some implementations of the present concepts. In this example, the compressed data structure 620 may be a compressed BVH structure having a certain compressed size. In one implementation, the compressed BVH structure may include header data 622, variance data 624, packed leaf data 626, and packed hierarchy data 628.

Consistent with the present concepts, a compression function may compress the uncompressed data structure 600 in FIG. 6A to generate the compressed data structure 620 in FIG. 6B, which may have a significantly reduced size compared to the uncompressed data structure 600. And then later, a decompression function may decompress the compressed data structure 620 in FIG. 6B to restore the uncompressed data structure in FIG. 6A.

For example, a compression function consistent with the present concepts may selectively remove parts and compact other parts of the uncompressed data structure 600 to generate the compressed data structure 620. The terms "remove," "delete," "strip," and similar terms are used herein to mean that certain data in the uncompressed data structure 600 is excluded from the compressed data structure 620, not necessarily that the data is actually removed from the uncompressed data structure 600. In one implementation, the parts selected for removal may be data that can be quickly reconstituted at runtime so as not to interfere with or obstruct the intended functions and uses of the uncompressed data structure 600 (for example, by a target platform, such as a PC or a game console).

For instance, the uncompressed data structure 600 may include data that exists in other sources. Such data can be removed from the uncompressed data structure 600 to reduce the compressed size of the compressed data structure 620, and then later reconstituted by sourcing the removed data from available sources. For example, the leaf data 606 may include polygon data (the triangle data 610, in this example), which may be duplicates of the polygon data in the models of the game. Accordingly, the triangle data 610 in the leaf data 606 may be restorable data that can be deleted. The remaining data in the leaf data 606 may include assigned triangle IDs for the leaf data 606 along with data that are used to define the order in which to process the triangle data 610. The remaining data may be retained in the compressed data structure 620 since the remaining data may not be recovered at runtime or may take a long time to recover at runtime. The retained data in the leaf data 606 may be compacted (or packed) to generate the packed leaf data 626. Examples of compacting data will be explained below in connection with FIG. 7. Removing the restorable data and compacting the retained data in the leaf data 606 may significantly reduce the compressed size of the compressed data structure 620 compared to the uncompressed size of the uncompressed data structure 600.

As another example, the uncompressed data structure 600 may include data that can be later rebuilt based on other available information. Such data can be removed from the uncompressed data structure 600 to reduce the size of the compressed data structure 620, and then later reconstituted by rebuilding it from other available information. For example, the parent data 604, which may include information about the hierarchy of the nodes, may be rebuildable data that can be stripped away to reduce the size of the uncompressed data structure 600. The parent data 604 may be rebuilt later based on walking the BVH hierarchy tree.

Additionally, the bounding volume data 612 in the hierarchy data 608 may be rebuildable data that can be excluded, because the bounding volumes can be later rebuilt from the triangle data 610. The remaining data in the hierarchy data 608 may include the IDs of child nodes, as mentioned above. The remaining data may be retained in the compressed data structure 620 since the remaining data may not be rebuilt at runtime or may take a long time to rebuild at runtime. The retained data in the hierarchy data 608 may be compacted to generate the packed hierarchy data 628. Omitting the parent data 604 altogether, removing the bounding volume data 612, and compacting the retained data in the hierarchy data 608 may significantly reduce the compressed size of the compressed data structure 620 compared to the uncompressed size of the uncompressed data structure 600.

In some cases, a bounding volume may not be simply the default minimally enclosing box around a triangle. As explained above in connection with FIG. 5, a BVH builder may use optimization techniques to construct multiple, smaller varied bounding volumes that fit an awkward-shaped triangle more tightly than one large default bounding volume. If the varied bounding volumes were deleted, then they may not be rebuilt later or at least not be rebuilt quickly enough at runtime to allow smooth rendering.

Accordingly, consistent with some implementations of the present concepts, before deleting a subject bounding volume from the hierarchy data 608, the compression function may calculate a check bounding volume based on the corresponding triangle. If the subject bounding volume in the hierarchy data 608 matches the check bounding volume, then the subject bounding volume can be deleted from the hierarchy data 608. This means that a default bounding volume that is rebuilt by the decompression function at runtime would match the original bounding volume that was deleted by the compression function.

On the other hand, if the subject bounding volume in the hierarchy data 608 differs from the check bounding volume, then the subject bounding volume (or the difference between the subject bounding volume and the check bounding volume) may be stored in the variance data 624 for the corresponding node in the compressed data structure 620. This means that the BVH builder has performed optimization to create varied bounding volumes that are different from the default bounding volume. Thus, deleting the varied bounding volumes would lose the benefits of the optimization. Including the variance data 624 in the compressed data structure 620 may ensure that the decompression function can rebuild the varied bounding volumes when the compressed data structure 620 is decompressed.

Consistent with the present concepts, the decompression function may decompress (or uncompress) the compressed data structure 620 to reobtain the uncompressed data structure 600. In some implementations, the exact original uncompressed data structure 600 may be restored so that it is compatible with GPUs for raytracing.

For example, the decompression function may restore the leaf data 606 by uncompacting (or unpacking) the packed leaf data 626 and reinserting the triangle data 610 back into the packed leaf data 626. The decompression function may source the triangle data 610 from the models of objects that are included in the game.

Furthermore, the decompression function may rebuild the hierarchy data 608 by uncompacting the packed hierarchy data 628, and recalculating the bounding volume data based on the triangle data. In one implementation, while rebuilding the hierarchy data 608, the decompression function may check whether the variance data 624 includes any differential information for a particular node. If the variance data 624 does not exist for the particular node, then the decompression function may calculate a default bounding volume based on the triangle data 610 and add the default bounding volume to the hierarchy data 608 for the particular node. If the variance data exists for the particular node, the decompression function may use the variance data 624 to rebuild the varied bounding volumes and add them back into the hierarchy data 608 for the particular node. Thus, the variance data 624 may serve as an override that can be used instead of the default bounding volumes when the compressed data structure 620 is decompressed.

In one implementation, the header data 602 in the uncompressed data structure 600 and the header data 622 in the compressed data structure 620 may include a compression flag 630 that indicates whether the data structure is compressed or uncompressed. Thus, the compression function may flip the compression flag 630 in the header data 602 of the uncompressed data structure 600 to generate the header data 622 of the compressed data structure 620. Similarly, the decompression function may flip (i.e., revert back) the compression flag 630 in the header data 622 of the compressed data structure 620 to restore the header data 602 of the uncompressed data structure 600.

Consistent with the present concepts, the uncompressed data structure 600 may be significantly reduced in size into the compressed data structure 620 using the above-described techniques. Therefore, the compressed data structure 620 can fit in smaller storage devices, take up less space in storage, be transferred faster, be installed faster, and be loaded into memory faster. These advantages may be achieved by actually removing data that can be later reconstituted. Therefore, the present concepts provide superior compression ratio compared to conventional lossless compression techniques.

Other benefits of the present concepts include the ability to restore the original uncompressed data structure 600 even though the compression function actually deleted data from it. Moreover, the decompression function can restore the original uncompressed data structure quickly at runtime.

Compression

Figure 7:
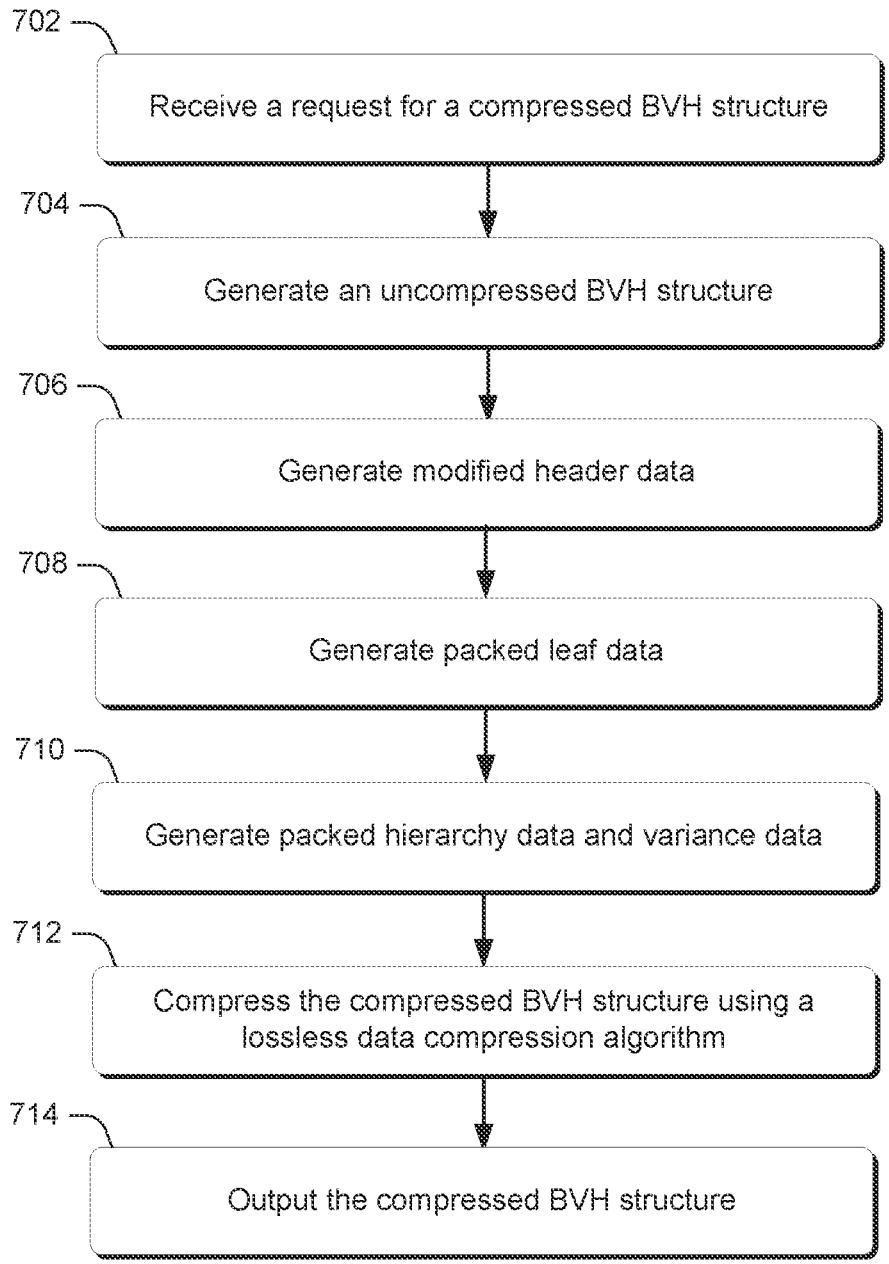
FIG. 7 shows a flow diagram of a compression method, consistent with some implementations of the present concepts.

FIG. 7 shows a flow diagram of a compression method 700, consistent with some implementations of the present concepts. The compression method 700 is presented for illustration purposes and is not meant to be exhaustive or limiting. The acts in the compression method 700 may be performed in the order presented, in a different order, or in parallel or simultaneously, may be omitted, and may include intermediary acts therebetween. The compression method 700 will be explained in the context of compressing an example uncompressed BVH structure illustrated in FIG. 6A into an example compressed BVH structure illustrated in FIG. 6B, but the compression method 700 may be applied to other data structures. In some implementations, the compression method 700 may be performed during offline development of a game.

In act 702, a request for a compressed BVH structure may be received. For example, a game developer may have developed the 3D models for objects in a virtual 3D world for the game. A game platform provider may have provided a game development kit ("GDK") to the game developer. The game developer may input the models and request that the GDK create a compressed BVH structure based on the models. In one implementation, the request for a compressed BVH structure may include an option flag indicating that the game developer wants the output to be a compressed BVH structure as opposed to an uncompressed BVH structure.

In act 704, an uncompressed BVH structure may be generated based on the models. For example, the GDK may include a BVH builder that can generate the full BVH structure from the models. In one implementation, the uncompressed BVH structure may include header data, parent data, leaf data, and hierarchy data. This uncompressed BVH structure may have been the output if the request in act 702 did not include the option flag indicating that a compressed BVH structure should be outputted.

In act 706, modified header data may be generated. In one implementation, the GDK may include a compression function that reads header data in the uncompressed BVH structure and switches a compression flag in the header data to generate the modified header data. The modified header data may be written to the compressed BVH structure. The compression flag may indicate that the compressed BVH structure is not the full uncompressed BVH structure and thus may be incompatible with GPUs for raytracing. That is, the compression flag may indicate that the compressed BVH structure may need to be decompressed before GPUs can use it for raytracing.

In act 708, packed leaf data for the compressed BVH structure may be generated based on leaf data in the uncompressed BVH structure. In one implementation, the compression function may divide the leaf data into restorable leaf data and retained leaf data. The compression function may remove any restorable data in the leaf data that can later be restored. For example, for each leaf node in the uncompressed BVH structure, triangle data may be restorable data that can later be found at runtime in the model data. Thus, the compression function may exclude the triangle data from the packed leaf data. The triangle data that exists in the models may be available at runtime for reconstitution by the decompression function, since the model data would be loaded at runtime to render the objects on a display screen.

Then, after removing the triangle data, the retained leaf data (the remaining data that has not be removed) in the leaf data may be packed into a much smaller space and written to the compressed BVH structure. In one implementation, the retained data may be compacted by packing the data into smaller-bit data structures. For example, the data in the uncompressed BVH structure may be encoded as 64 bits (e.g., according to GPU requirements). However, if the retained data holds values that could be encoded using fewer bits (e.g., 32 bits, 16 bits, 8 bits, etc.), then the retained data could be packed down to a much smaller data type that takes fewer bits to encode than 64 bits. Therefore, consistent with some implementations of the present concepts, even the retained data in the packed leaf data of the compressed BVH structure may take up less storage space.

In act 710, packed hierarchy data and variance data for the compressed BVH structure may be generated based on hierarchy data in the uncompressed BVH structure. In one implementation, the compression function may divide the hierarchy data into rebuildable hierarchy data and retained hierarchy data. The compression function may omit any rebuildable data in the hierarchy data that can later be rebuilt from the packed hierarchy data in the compressed BVH structure. For example, for each intermediary node in the uncompressed BVH structure, any bounding volume data that can be rebuilt quickly at runtime from the triangle data may be excluded from the packed hierarchy data of the compressed BVH structure. The decompression function may access the triangle data to rebuild the bounding volume data at runtime, because the triangle data would have been loaded from the models at runtime to render the objects on a display screen.

For example, for each intermediary node in the hierarchy data of the uncompressed BVH structure, the decompression function may calculate a check bounding volume based on the triangle data. If the existing bounding volume in the subject intermediary node matches the check bounding volume, then the existing bounding volume may be discarded, since it is a default bounding volume that can be rebuilt at runtime. Otherwise, if the existing bounding volume in the subject intermediary node does not match the check bounding volume, then the existing bounding volume is a varied bounding volume that may not be quickly rebuilt at runtime. Accordingly, varied bounding volumes or the difference/variance between the varied bounding volume and the check bounding volume may be stored in the variance data of the compressed BVH structure.

As illustrated above in connection with FIG. 5, edge cases involving very long and thin triangles on diagonal angles or objects having irregular shapes (e.g., a spiky shape) may cause the BVH builder to create varied bounding volumes that are optimized over default bounding volumes. If the varied bounding volumes were deleted, then less-optimal default bounding volumes would be rebuilt during decompression or the varied bounding volumes may take too long to recreate at runtime. Therefore, the compression function may keep the varied bounding volume data in the variance data of the compressed BVH structure.

The retained hierarchy data (the remaining data that has not been removed) in the hierarchy data, such as the individual node data and child node data, may be compacted into a smaller space to generate the packed hierarchy data and written to the compressed BVH structure. For example, the links between the nodes (i.e., the links between the bounding volumes) that were built offline may not be reconstituted quickly at runtime to enable fast enough raytracing for rendering the game scenes in real time. Thus, the connections between the bounding volumes may be kept, whereas the sizes of the bounding volumes may be discarded. Additionally, in one implementation, the variance data may be compacted to save storage space since the variance data need not conform to any GPU-compatible formats.

In act 712, the compressed BVH structure may be compressed using a lossless data compression algorithm. For example, the compressed BVH structure that includes the modified header data, the variance data, the packed leaf data, and the hierarchy data may be zipped into a zip file format that would preserve the data without losing any information. In one implementation, the lossless data compression algorithm may be agnostic of data being compressed. The lossless data compression algorithm may reduce the size of the compressed BVH structure even further for storage and/or transfers without losing any data.

In act 714, the compressed BVH structure may be output in response to the request in act 702. In some implementations, the compressed BVH structure may include the modified header data generated in act 706, the packed leaf data generated in act 708, and the packed hierarchy data and the variance data generated in act 710.

Therefore, the compression method 700 may traverse the BVH tree, for example, starting from the root node, through intermediary nodes, and down to the leaf nodes, and up and down the tree, and so forth. Furthermore, the compression method 700 may skip or ignore parent data in the uncompressed BVH structure.

Accordingly, the present concepts may strip out information from the uncompressed BVH structure during offline compression that can be quickly recreated at runtime while keeping information that cannot be recreated or is hard to recalculate quickly at runtime. In this example, the compression method 700 may strip out the triangle data from the leaf data, discard the default bounding volume data from the hierarchy data, and remove the parent data containing the hierarchy tree information completely. The removed data can be reconstituted at runtime without much computational difficulty, and thus raytracing can still be performed in real time at runtime. For example, a typical medium-sized object may take 3-4 milliseconds (ms) to decompress a compressed BVH structure for the object. Such fast decompression can be performed at runtime without substantially delaying the raytracing process. The decompression time may vary with the size and complexity of the object, which will be illustrated below where experimental test results are discussed.

A better compression ratio may be achieved by removing more data from the uncompressed data structure, resulting in smaller compressed data structure that take up less storage space and can be transferred faster through a network.

However, the desire to shrink the data structure may be weighed with greater processing that may be required for decompression at runtime. Accordingly, consistent with some implementations of the present concepts, the choice of which data to remove and which data to keep when compressing the data structure may be constrained by one or more factors. Therefore, depending on the intended use of the data structure, the types of data that could be removed during compression may depend on how much time it takes to reconstitute the removed data during decompression.

For example, data that would take too much time to reconstitute at runtime, such that raytracing by the GPU would be substantially slowed down, causing noticeable delay in scene rendering by the user, may be kept in the compressed BVH structure. If reconstitution takes too much time, then the ability to play the game in real time may be adversely affected. Conversely, data that can be reconstituted quickly at runtime, such that the GPU can still perform raytracing and render an entire frame in about 16 ms (assuming 60 hertz (Hz) frame rate), may be omitted from the compressed BVH structure.

Consistent with some implementations of with the present concepts, the compression method 700 may be performed offline when the game is being developed before release. Accordingly, the speed at which the compression method 700 can be performed (e.g., the time it takes to compress the BVH structure) may be less important than the speed at which the BVH structure can be decompressed at runtime. The present concepts may take advantage of this offline leisure by spending additional time to compress the BVH structure into a significantly smaller size.

In one implementation, the game developer may be provided with options on the degree to which the BVH structure may be compressed. For example, if too much data were aggressively removed from the compressed BVH structure, then game scene rendering may be noticeably slowed down on a slower PC or an older game console. Accordingly, the game developer may provide an input along with the request for a compressed BVH structure that indicates how aggressively or conservatively to remove data from the uncompressed BVH structure. More data removed offline would result in slower reconstitution at runtime, whereas less data removed offline would allow faster reconstitution at runtime.

Additionally, in one implementation, the game developer may be able to configure limits and/or criteria for the data that may be removed from the BVH structure during compression. For example, the game developer may input a threshold size for an uncompressed BVH structure that may be compressed. If the BVH structure were too large (e.g., larger than 1 GB), then reconstituting such a large BVH structure at runtime may take too much time and noticeably interfere with the game scene rendering process.

Other techniques for allowing the game developer to tune how much to compress data structures are possible. For example, for a larger BVH structure, the triangle data may be removed but the bounding volume data may be kept, since it take less time to reinsert the triangle data from the model data at runtime than to recalculate the bounding volumes at runtime.

Decompression

Figure 8:
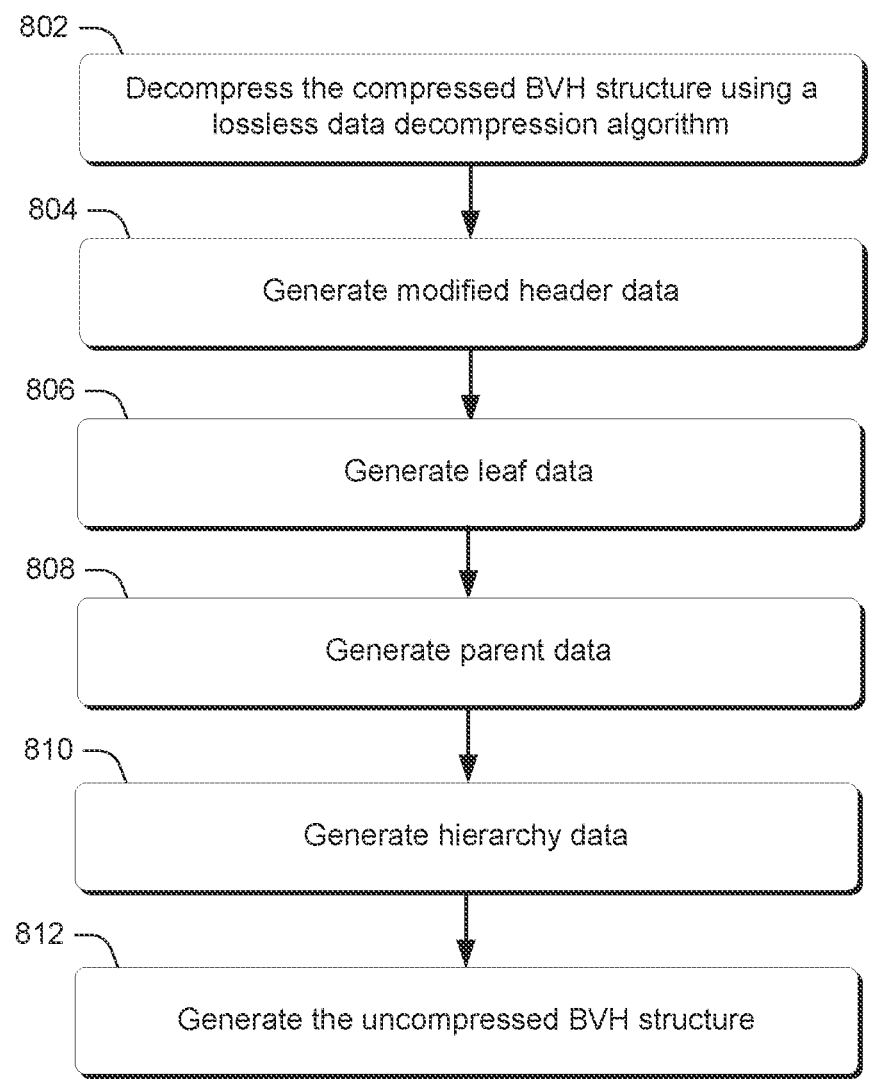
FIG. 8 shows a flow diagram of a decompression method, consistent with some implementations of the present concepts.

FIG. 8 shows a flow diagram of a decompression method 800, consistent with some implementations of the present concepts. The decompression method 800 is presented for illustration purposes and is not meant to be exhaustive or limiting. The acts in the decompression method 800 may be performed in the order presented, in a different order, or in parallel or simultaneously, may be omitted, and may include intermediary acts therebetween. The decompression method 800 will be explained in the context of decompressing an example compressed BVH structure illustrated in FIG. 6B into an example uncompressed BVH structure illustrated in FIG. 6A, but the decompression method 800 may be applied to other data structures. In some implementations, the decompression method 800 may be performed at runtime while a game is being played.

For example, as the game is being played, whatever object in the virtual 3D world is needed for raytracing, a BVH structure for the object may be provided to a GPU to perform raytracing in connection with rendering a scene on a display screen. Accordingly, the decompression method 800 may be performed (for example, by a decompression function) to decompress a compressed BVH structure corresponding to the object into a format that is compatible with the GPU. Consistent with the present concepts, the decompression method 800 may involve reconstituting the data that was removed by the compression method 700.

In act 802, the compressed BVH structure may be decompressed using a lossless data decompression algorithm. The lossless data decompression algorithm may be the inverse function of the lossless data compression algorithm used in act 712 of the compression method 700. For example, if the compressed BVH structure were zipped in act 712, then the zip file may be unzipped in act 802.

In act 804, modified header data may be generated based on header data in the compressed BVH structure. In one implementation, the header data in the compressed BVH structure may include a compression flag that is set to indicate that the BVH structure is compressed and should be decompressed before providing it to the GPU. For example, the compression flag may be switched (e.g., flipped, unset, reset, or removed) to generate the modified header data that may be included in the uncompressed BVH structure. Thus, the modified header data in the uncompressed BVH structure may indicate that the uncompressed BVH structure has been decompressed into a format that is compatible with the GPU.

In act 806, leaf data may be generated based on packed leaf data in the compressed BVH structure and triangle data in the model. In one implementation, for each leaf node in the compressed BVH structure, the retained data in the leaf node may be unpacked (or uncompacted) and the corresponding triangle data in the model may be added to the leaf data of the uncompressed BVH structure. That is, the retained data that was packed in act 708 may be unpacked into their original data structure (e.g., encoded in 64 bits), and the removed triangle data may be sourced from the model and reinserted into the leaf data.

Since the decompression method 800 may be performed at runtime when the game is being played, the model data may already be loaded into memory for rendering objects. Consistent with the present concepts, the reconstitution of the triangle data may be performed quickly so that the decompression method 800 and raytracing by the GPU can be performed in real time without any noticeable delay in gameplay or scene rendering, such as jittering, flickering, stalling, or hitching.

In act 808, parent data may be recreated based on packed hierarchy data in the compressed BVH structure. In act 810, hierarchy data may be generated based on the packed hierarchy data and variance data in the compressed BVH structure. The packed hierarchy data and the variance data may be unpacked into their original data structure (e.g., encoded in 64 bits).

In one implementation, for each intermediary node and the root node in the compressed BVH structure, the decompress function may walk the hierarchy tree to all the child nodes in turn (for example, using a depth-first method) and perform acts 808 and 810. That is, for a particular node, the parent data for the node may be rebuilt based on node data in the packed hierarchy data. Furthermore, for the particular node, the decompression function may calculate a default bounding volume based on the child nodes (whether they contain triangle data or bounding volume data). If there is no variance data for the particular node, then the default bounding volume may be included in the hierarchy data for the uncompressed BVH structure. If there is variance data for the particular node, then the decompression function may use the variance data to rebuild varied bounding volumes to be included in the hierarchy data for the uncompressed BVH structure.

Consistent with the present concepts, the reconstitution of the parent data and the bounding volume data may be performed quickly so that the decompression method 800 and the raytracing by the GPU can be performed in real time without any noticeable delay in gameplay or scene rendering. Calculating the default bounding volumes as 3D boxes that minimally encapsulate the triangles in the leaf nodes may be performed rather quickly at runtime. However, the optimization process of generating varied bounding volumes for a tighter fit around odd-shaped triangles may take too long to perform at runtime. Therefore, consistent with some implementations of the present concepts, the variance data associated with the varied bounding volumes may be kept in the compressed BVH structure and then used at runtime to quickly rebuild the varied bounding volumes in the uncompressed BVH structure. This way, the benefits obtained through the optimization process are not lost.

In step 812, the uncompressed BVH structure may be generated. In some implementations, the uncompressed BVH structure may include the modified header data generated in act 804, the parent data generated in act 808, the leaf data generated in act 806, and the hierarchy data generated in act 810. As mentioned above, the uncompressed BVH structure may either be missing the compression flag or have the compression flag set to indicate that the uncompressed BVH structure has been decompressed and is compatible with the GPU. In one implementation, the uncompressed BVH structure may be validated using one or more validation checks to confirm that the uncompressed BVH structure has been reconstituted correctly and conforms to the format that is compatible with the GPU. In some implementations, the uncompressed BVH structure may be written to a target memory location or sent to the GPU for raytracing.

Consistent with the present concepts, the uncompressed BVH structure that is generated by the decompression method 800 may be the same uncompressed BVH structure that the compression method 700 started with (i.e., the same size and the same composition bit by bit). Therefore, although the present concepts involve data removal to significantly reduce storage space and transfer times, the removed data may be restored such that the end result after decompression may be lossless.

In one implementation, the decompression method 800 may be performed at runtime on a per-object basis (i.e., as-needed basis) during gameplay depending on which objects need to be tested for raytracing based on the current game state. That is, if a new object is loaded into the virtual 3D world as the game state changes, then the decompression method 800 may decompress the compressed BVH structure for the new object. For example, referring back to the example scene 100 in FIG. 1, if the game continues to be played and a new object (e.g., a truck on the road) enters the scene, then in order to perform raytracing involving the truck and to render the truck on the display screen, a compressed BVH structure corresponding to the truck object may be loaded into memory and the decompression method 800 may be performed to generate an uncompressed BVH structure for the truck.

In one implementation, if the game state changes such that the truck is no longer in the current scene, the uncompressed BVH structure may be dumped from memory. As such, if the truck re-enters the scene later, the decompression method 800 may be performed again to regenerate the uncompressed BVH structure for the truck.

Alternatively, the uncompressed BVH structures may be kept in memory even if the corresponding objects have left the scene, assuming there is sufficient memory space to hold the BVH structures for all objects that have entered the scene at some point in the game. As another alternative, all compressed BVH structures for all objects in the game may be decompressed when the game is initialized. This alternative may speed up raytracing at runtime as the game is being played. However, this alternative may consume a lot of active memory space and also delay the game initialization process. As yet another alternative, all compressed BVH structures for all objects in the game may be decompressed when the game is installed on the PC. This alternative may also speed up raytracing at runtime. However, the installed game may take up a larger amount of hard drive space, and the time to install the game may be longer. Nonetheless, this alternative may be useful where transfer time is a constraint (e.g., network bandwidth is limited) but storage space is plentiful.

Experimental Tests

Experimental tests have been conducted during the development of various implementations of the present concepts. For example, in one set of tests, publicly available open source models were used to create standard uncompressed BVH data files. Then, compressed BVH data files were generated based on the uncompressed BVH data files using the compression techniques consistent with the present concepts. Furthermore, the compressed BVH data files were decompressed to restore the uncompressed BVH data files. Various measurements were taken. One example set of test results are shown below in TABLE 1. The table includes (from the far left column to the far right column) the description of the open source model, the size of the original uncompressed BVH data file in bytes, the size of the compressed BVH data file in bytes, the compression ratio as a percentage of the original BVH data file size, the compression multiples as a multiplier factor smaller than the original BVH data file size, the runtime decompression time in milliseconds, and the decompression throughput in megabytes per second.

TABLE 1

| Model | Original BVH Size (bytes) | Comp. BVH Size (bytes) | Comp. Ratio (%) | Comp. Multiple (factor) | Decomp. Time (ms) | Decomp. Thruput (MB/s) |
| --- | --- | --- | --- | --- | --- | --- |
| Seedpod | 4,416 | 1,108 | 25.09 | 3.99 | 0.01 | 701 |
| Pebbles | 28,992 | 6,736 | 23.23 | 4.30 | 0.03 | 864 |
| Shells | 162,816 | 35,156 | 21.59 | 4.63 | 0.14 | 1,125 |
| Rose | 575,872 | 111,048 | 19.28 | 5.19 | 0.40 | 1,370 |
| Rocks | 3,235,008 | 685,304 | 21.18 | 4.72 | 1.92 | 1,605 |
| Mountain | 10,509,632 | 2,137,540 | 20.34 | 4.92 | 7.56 | 1,326 |
| Dragon | 14,503,296 | 2,822,844 | 19.46 | 5.14 | 13.60 | 1.017 |
| Cedar | 60,377,408 | 9,942,968 | 16.47 | 6.07 | 25.49 | 2.259 |
| Ironwood | 231,025,472 | 48,077,368 | 20.81 | 4.81 | 135.35 | 1,628 |
| Ocean | 1,197,620,224 | 181,137,404 | 15.12 | 6.61 | 536.16 | 2,130 |

The test results in TABLE 1 show that the present concepts can significantly reduce the size of a BVH data file to around 15% to 25%. That is, the present concepts can compress a BVH data file to around 4 to 6 times smaller in size. The general trend shows that the compression ratio and the corresponding compression multiplier improve as the size of the BVH data file increases. Moreover, decompression times are fast for small and medium sized models, and are reasonable for large models. Only very large models have slow decompression times that may cause noticeable rendering delays. However, in practice, most games rarely, if ever, have multiple very large models enter a new scene simultaneously as gameplay advances. Moreover, the decompression throughput rate does not increase too quickly as the size of the BVH file increases. These are promising results that show that the present concepts are practical and effective in significantly reducing the size of BVH offline while still allowing fast raytracing at runtime.

System Environment

Figure 9:
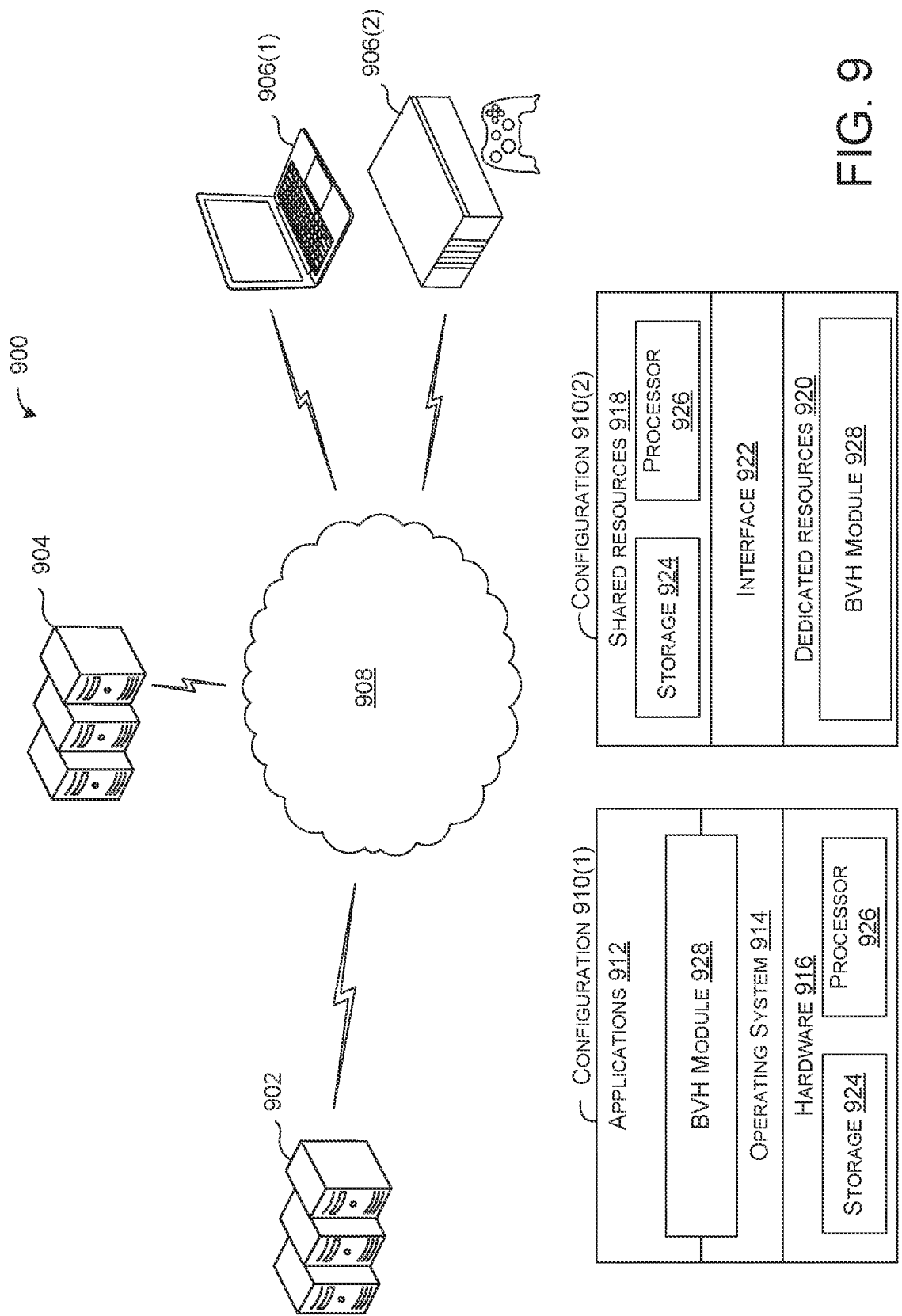
FIG. 9 shows an environment, consistent with some implementations of the present concepts.

FIG. 9 shows an environment 900, consistent with some implementations of the present concepts. This example environment 900 may include a game platform provider device 902, a game developer device 904, and a game player device 906. A network 908 may connect and enable communication among the devices 902, 904, 906. The network 908 may include multiple networks and/or may include the Internet.

In one implementation, the game platform provider device 902 may include one or more server computers. A game platform provider may use the game platform provider device 902 to develop and provide a game platform on which game developers can make games and on which game players can play games. For example, the game platform provider may create a GDK that includes a suite of software tools that a game developer can use to develop games for the platform. Consistent with some implementations of the present concepts, the GDK may include a compression function, which can generate a compressed BVH structure based on model data, and a decompression function, which can decompress a compressed BVH structure into an uncompressed BVH structure. For example, the compression function may perform the compression method 700, and the decompression function may perform the decompression method 800, described above. The GDK may be hosted on the game platform provider device 902 and shared with game developers to download over the network 908.

In one implementation, the game developer device 904 may include one or more server computers. A game developer may use the game developer device 904 to develop a game that can be played on the game platform. For example, the game developer may download the GDK from the game platform provider device 902 onto the game developer device 904. The game developer may design, create, package, and release a game, for example, using the GDK. For instance, the game developer may design 3D objects, create models for the objects, and use the compression function in the GDK to generate compressed BVH data files for the models. The model data and the compressed BVH data files, along with other game components, may be packaged and then released to game players. Alternatively, the game may be provided to the game platform provider to be played remotely as an online game by game players.

In one implementation, the game may be downloaded by the game player onto the game player device 906. The game may be hosted and made available for download on the game developer device 904 and/or the game platform provider device 902. Alternatively or additionally, the game may be stored on a removable storage (e.g., a disc or a flash drive) and shipped to game players and/or sold at retail stores.

In one implementation, the game player device 906 may include one or more client computers. FIG. 9 shows two examples of client computers: a PC 906(1) and a game console 906(2). Other examples of client computers are possible, including server computers, notebook computers, cellular phones, smartphones, personal digital assistants, tablet computers, cameras, appliances, virtual reality headsets, controllers, smart devices, IoT devices, vehicles, etc., and/or any of a myriad of ever-evolving or yet-to-be-developed electronic devices. The game player device 906 may include a GPU and/or can communicate with a GPU to render scenes from the game onto a display screen.

The game player may use the game player device 906 to browse, purchase, download, install, and/or play the game on the game platform. For example, the game player may download the game from the game developer device 904 and install the game on the PC 906(1). As another example, the game player may purchase a game disc from a store and insert the disc into the game console 906(2). The number of devices and the client-versus-server side of the devices described and depicted in connection with FIG. 9 are intended to be illustrative and are non-limiting.

Consistent with some implementations of the present concepts, the game on the game player device 906 may include compressed BVH structures associated with models. In one implementation, the game may include the decompression function that can decompress the compressed BVH structures into uncompressed BVH structures that are compatible with GPUs. Alternatively, the decompression function may be provided by the game platform provider to the game player device 906. For example, the game console 906(2) may include the decompression function independent of the games. Similarly, the PC 906(1) may download and install the game platform software that includes the decompression function from the game platform provider device 902.

In some implementations, the game platform provider and/or the game developer may make the compression function and/or the decompression function. The game developer may use the compression function during offline development of the game. The game player may use the decompression function at runtime while playing the game.

The term "device," "computer," or "computing device" as used herein can mean any type of device that has some amount of processing capability and/or storage capability. Processing capability can be provided by one or more hardware processors that can execute data in the form of computer-readable instructions to provide a functionality. Data, such as computer-readable instructions and/or user-related data, can be stored on storage, such as storage that can be internal or external to the device. The storage can include any one or more of volatile or non-volatile memory, hard drives, flash storage devices, optical storage devices (e.g., CDs, DVDs etc.), and/or remote storage (e.g., cloud-based storage), among others. As used herein, the term "computer-readable media" can include transitory propagating signals. In contrast, the term "computer-readable storage media" excludes transitory propagating signals. Computer-readable storage media may include computer-readable storage devices. Examples of computer-readable storage devices may include volatile storage media, such as RAM, and non-volatile storage media, such as hard drives, optical discs, and flash memory, among others.

FIG. 9 shows two device configurations 910(1) and 910(2) that can be employed by any or all of the devices 902, 904, 906. Individual devices 902, 904, 906 can employ either of the configurations 910(1) or 910(2), or an alternate configuration. One instance of each configuration 910 is illustrated in FIG. 9. Briefly, device configuration 910(1) may represent an operating system (OS) centric configuration. Configuration 910(2) may represent a system on a chip (SOC) configuration. Configuration 910(1) can be organized into one or more applications 912, operating system 914, and hardware 916. Configuration 910(2) may be organized into shared resources 918, dedicated resources 920, and an interface 922 there between.

In either configuration 910, the device 902, 904, 906 can include a storage 924 and a processor 926. The device 902, 904, 906 can also include a BVH module 928. For example, the BVH module 928 may include a compression function and/or a decompression function.

As mentioned above, configuration 910(2) can be thought of as a system on a chip (SoC) type design. In such a case, functionality provided by the device can be integrated on a single SoC or multiple coupled SoCs. One or more processors 926 can be configured to coordinate with shared resources 918, such as storage 924, etc., and/or one or more dedicated resources 920, such as hardware blocks configured to perform certain specific functionality. Thus, the term "processor" as used herein can also refer to central processing units (CPUs), graphical processing units (GPUs), controllers, microcontrollers, processor cores, or other types of processing devices.

Generally, any of the functions described herein can be implemented using software, firmware, hardware (e.g., fixed-logic circuitry), or a combination of these implementations. The term "component" as used herein generally represents software, firmware, hardware, whole devices or networks, or a combination thereof. In the case of a software implementation, for instance, these may represent program code that performs specified tasks when executed on a processor (e.g., CPU or CPUs). The program code can be stored in one or more computer-readable memory devices, such as computer-readable storage media. The features and techniques of the component are platform-independent, meaning that they may be implemented on a variety of commercial computing platforms having a variety of processing configurations.

Applications

The present concepts have been explained above in the context of example scenarios involving using BVH to perform raytracing in gaming. However, the present concepts have a wide range of applications and may be applied to other contexts.

For example, the present concepts may be applied where BVH is used for raytracing in other fields besides gaming, such as the cinematic film field or the virtual/augmented reality field. Furthermore, the present concepts may be applied to BVH used for other applications besides raytracing, such as collision detection. In any field where BVH is used, the present concepts can significantly reduce the size of the BVH structures, and thus are beneficial especially where storage space is limited or transfer times are a concern.

Moreover, the present concepts are not limited to BVH and can be applied to other data structures. For example, any data structure that includes data that exists in another source or that can be reconstructed from other available information may be compressed by removing such data using the techniques described above. Furthermore, the retained data that is not removed may be compacted into a smaller-bit encoding data type. Then later, the compacted data may be unpacked and the removed data may be reconstituted to obtain the original uncompressed data structure.

Various examples are described above. Additional examples are described below. Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims and other features and acts that would be recognized by one skilled in the art are intended to be within the scope of the claims.

Various examples are described above. Additional examples are described below. One example includes a method comprising receiving a request for a compressed bounding volume hierarchy (BVH) structure for a model, generating an uncompressed BVH structure for the model, the uncompressed BVH structure including leaf data and hierarchy data, generating packed leaf data by omitting triangle data in the leaf data that exists in the model and packing retained leaf data in the leaf data, generating packed hierarchy data by omitting default bounding volume data in the hierarchy data that can be recreated based on the triangle data and packing retained hierarchy data in the hierarchy data, and outputting the compressed BVH structure including the packed leaf data and the packed hierarchy data, a compressed size of the compressed BVH structure being smaller than an uncompressed size of the uncompressed BVH structure.

Another example can include any of the above and/or below examples where the method further comprises generating modified header data by changing a compression flag in header data of the uncompressed BVH structure, where the compressed BVH structure includes the modified header data.

Another example can include any of the above and/or below examples where the method further comprises compressing the packed leaf data and the packed hierarchy data using a lossless compression algorithm.

Another example can include any of the above and/or below examples where the method further comprises excluding parent data from the compressed BVH structure, where the uncompressed BVH structure includes the parent data.

Another example can include a device comprising a processor and a storage for storing instructions which, when executed by the processor, cause the processor to, generate an uncompressed data structure for a model, the uncompressed data structure including header data, leaf data, and hierarchy data, generate packed leaf data based on the leaf data of the uncompressed data structure, generate packed hierarchy data based on the hierarchy data of the uncompressed data structure, generate a compressed data structure for the model, the compressed data structure including the packed leaf data and the packed hierarchy data, and output the compressed data structure for packaging with the model, a compressed size of the compressed data structure being smaller than an uncompressed size of the uncompressed data structure.

Another example can include any of the above and/or below examples where the packed leaf data excludes triangle data in the leaf data.

Another example can include any of the above and/or below examples where the packed hierarchy data excludes default bounding volumes in the hierarchy data.

Another example can include any of the above and/or below examples where the instructions further cause the processor to generate modified header data based on the header data of the uncompressed data structure, where the compressed data structure includes the modified header data.

Another example can include A computer-readable storage medium storing instructions which, when executed by a processor, cause the processor to receive a request for a compressed data structure associated with a model, generate an uncompressed data structure for the model, the uncompressed data structure including leaf data and hierarchy data, and generate the compressed data structure by removing restorable leaf data in the leaf data and keeping retained leaf data in the leaf data and removing rebuildable hierarchy data in the hierarchy data and keeping retained hierarchy data in the hierarchy data, and output the compressed data structure, a compressed size of the compressed data structure being smaller than an uncompressed size of the uncompressed data structure.

Another example can include any of the above and/or below examples where the instructions further cause the processor to generate packed leaf data by packing the retained leaf data and generate packed hierarchy data by packing the retained hierarchy data, where the compressed data structure includes the packed leaf data and the packed hierarchy data.

Another example can include any of the above and/or below examples where the restorable leaf data includes triangle data that is included in the model.

Another example can include any of the above and/or below examples where the rebuildable hierarchy data includes bounding volume data.

Another example can include any of the above and/or below examples where removing the rebuildable hierarchy data comprises calculating a check bounding volume based on a triangle, comparing a bounding volume of the triangle in the hierarchy data with the check bounding volume, and in response to determining that the bounding volume does not match the check bounding volume, generating variance data based on the bounding volume, where the compressed data structure includes the variance data.

Another example can include any of the above and/or below examples where the instructions further cause the processor to generate modified header data based on header data of the uncompressed data structure, where the compressed data structure includes the modified header data.

Another example can include a computer-readable storage medium storing instructions which, when executed by a processor, cause the processor to generate leaf data based on packed leaf data in a compressed data structure associated with a model and triangle data in the model, generate hierarchy data based on packed hierarchy data and variance data in the compressed data structure, generate parent data based on the packed hierarchy data, generate an uncompressed data structure including the parent data, the leaf data, and the hierarchy data, and output the uncompressed data structure for use by a graphics processing unit (GPU) in raytracing involving the model, a compressed size of the compressed data structure being smaller than an uncompressed size of the uncompressed data structure.

Another example can include any of the above and/or below examples where generating the leaf data comprises unpacking the packed leaf data and restoring the triangle data from the model into the leaf data.

Another example can include any of the above and/or below examples where generating the hierarchy data comprises unpacking the packed hierarchy data, calculating a default bounding volume for a node based on a triangle, determining whether the variance data exists for the node, and in response to determining that the variance data does not exist for the node, adding the default bounding volume for the node into the hierarchy data.

Another example can include any of the above and/or below examples where generating the hierarchy data further comprises, in response to determining that the variance data exists for the node, calculating a varied bounding volume for the node based on the default bounding volume and the variance data and adding the varied bounding volume for the node into the hierarchy data.

Another example can include any of the above and/or below examples where the instructions further cause the processor to generate modified header data by changing a compression flag in header data of the compressed data structure, where the uncompressed data structure includes the modified header data.

Another example can include any of the above and/or below examples where the uncompressed data structure is compatible with the GPU.

The invention claimed is:
1. A method, comprising:
receiving a request for a compressed bounding volume hierarchy (BVH) structure for a model;
generating an uncompressed BVH structure for the model, the uncompressed BVH structure including leaf data and hierarchy data;
generating packed leaf data by omitting triangle data in the leaf data that exists in the model and packing retained leaf data in the leaf data;
generating packed hierarchy data by omitting default bounding volume data in the hierarchy data that can be recreated based on the triangle data and packing retained hierarchy data in the hierarchy data; and outputting the compressed BVH structure including the packed leaf data and the packed hierarchy data, a compressed size of the compressed BVH structure being smaller than an uncompressed size of the uncompressed BVH structure.

2. The method of claim 1, further comprising:
generating modified header data by changing a compression flag in header data of the uncompressed BVH structure;
wherein the compressed BVH structure includes the modified header data.

3. The method of claim 1, further comprising:
compressing the packed leaf data and the packed hierarchy data using a lossless compression algorithm.

4. The method of claim 1, further comprising:
excluding parent data from the compressed BVH structure,
wherein the uncompressed BVH structure includes the parent data.

5. A device, comprising:
a processor; and
a storage for storing instructions which, when executed by the processor, cause the processor to:
generate an uncompressed data structure for a model, the uncompressed data structure including header data, leaf data, and hierarchy data;
generate packed leaf data based on the leaf data of the uncompressed data structure;
generate packed hierarchy data based on the hierarchy data of the uncompressed data structure;
generate a compressed data structure for the model, the compressed data structure including the packed leaf data and the packed hierarchy data; and
output the compressed data structure for packaging with the model, a compressed size of the compressed data structure being smaller than an uncompressed size of the uncompressed data structure.

6. The device of claim 5, wherein the packed leaf data excludes triangle data in the leaf data.

7. The device of claim 5, wherein the packed hierarchy data excludes default bounding volumes in the hierarchy data.

8. The device of claim 5, wherein the instructions further cause the processor to:
generate modified header data based on the header data of the uncompressed data structure;
wherein the compressed data structure includes the modified header data.

9. The method of claim 1, further comprising:
dividing the leaf data into restorable leaf data and retained leaf data.

10. The method of claim 9, wherein generating the packed leaf data includes omitting the restorable leaf data.

11. The method of claim 9, wherein the restorable leaf data includes the triangle data.

12. The method of claim 1, further comprising:
dividing the hierarchy data into rebuildable hierarchy data and retained hierarchy data.

13. The method of claim 12, wherein generating the packed hierarchy data includes removing the rebuildable hierarchy data.

14. The method of claim 13, wherein removing the rebuildable hierarchy data comprises:
calculating a check bounding volume based on a triangle;
comparing a bounding volume of the triangle in the hierarchy data with the check bounding volume; and
in response to determining that the bounding volume does not match the check bounding volume, generating variance data based on the bounding volume,
wherein the compressed BVH structure includes the variance data.

15. The method of claim 12, wherein the rebuildable hierarchy data includes the default bounding volume data.

16. The device of claim 5, wherein the instructions further cause the processor to:
divide the leaf data into restorable leaf data and retained leaf data.

17. The device of claim 16, wherein the packed leaf data omits the restorable leaf data and includes the retained leaf data.

18. The device of claim 5, wherein the instructions further cause the processor to:
divide the hierarchy data into rebuildable hierarchy data and retained hierarchy data.

19. The device of claim 18, wherein the packed hierarchy data omits the rebuildable hierarchy data and includes the retained hierarchy data.

20. The device of claim 18, wherein the instructions further cause the processor to:
calculate a check bounding volume based on a triangle;
compare a bounding volume of the triangle in the hierarchy data with the check bounding volume; and
in response to determining that the bounding volume does not match the check bounding volume, generate variance data based on the bounding volume,
wherein the compressed data structure includes the variance data.

* * * * *